United States Patent
Leng et al.

(10) Patent No.: US 6,965,136 B2
(45) Date of Patent: Nov. 15, 2005

(54) PHOTON-BLOCKING LAYER

(75) Inventors: Yaojian Leng, Plano, TX (US); Honglin Guo, Plano, TX (US); Joe W. McPherson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/684,617

(22) Filed: Oct. 14, 2003

(65) Prior Publication Data
US 2004/0102000 A1 May 27, 2004

Related U.S. Application Data

(62) Division of application No. 10/319,149, filed on Dec. 13, 2002, now Pat. No. 6,919,219.
(60) Provisional application No. 60/430,627, filed on Dec. 3, 2002, provisional application No. 60/428,118, filed on Nov. 21, 2002.

(51) Int. Cl.[7] .......................................... H01L 31/0232
(52) U.S. Cl. ..................................... 257/294; 257/435
(58) Field of Search ............................... 257/294, 435, 257/436, 734

(56) References Cited

U.S. PATENT DOCUMENTS 6,251,787 B1    6/2001  Edelstein et al.
6,630,736 B1 *  10/2003 Ignaut ......................... 257/737
6,738,538 B2 *  5/2004  Antaki et al. .................. 385/14

OTHER PUBLICATIONS

A. Beverina et al., "Copper Photocorrosion Phenomenon During Post CMP Cleaning" *Electrochemical and Solid-State Letters,* pp. 156-158, 2000.

Yoshio Homma et al., "Control of Photocorrosion in the Copper Damascene Process" *Journal of the Electrochemical Society,* pp. 1193-1198, 2000.

* cited by examiner

*Primary Examiner*—Roy Potter

(74) *Attorney, Agent, or Firm*—Rose Alyssa Keagy; W. James Brady, III; Frederick J. Telecky, Jr.

(57) ABSTRACT

An embodiment of the invention is a method to reduce light induced corrosion and re-deposition of a metal, 8, (such as copper) that is used to make the interconnect wiring during the semiconductor manufacturing process. The light induced corrosion and re-deposition is caused by the exposure of a P-N junction to light, causing a photovoltaic effect. A photon-blocking layer, 13, is used in the invention to reduce the amount of exposure of the P-N junction to light. The photon blocking layer, 13, of the invention may be a direct band-gap material with a band-gap energy that is less than the lower edge of the energy spectrum of a typical light source used in the semiconductor manufacturing facility (typically less than 1.7 eV).

14 Claims, 3 Drawing Sheets

PHOTON-BLOCKING LAYER

CROSS-REFERENCE TO RELATED APPLICATIONS

This is a division of application Ser. No. 10/319,149, filed Dec. 13, 2002 now U.S. Pat. No 6,919,219, the entire disclosure of which is hereby incorporated by reference.

This application claims the benefit of U.S. Provisional Application Nos. 60/428,118 filed Nov. 21, 2002 and 60/430,627 filed Dec. 3, 2002.

BACKGROUND OF THE INVENTION

This invention relates to photo induced metal corrosion and re-deposition in a semiconductor wafer.

DETAILED DESCRIPTION OF THE INVENTION

The use of a photon-blocking layer that is located within a semiconductor wafer will minimize the occurrence of photo induced metal corrosion and re-deposition. Several aspects of this invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

Figures 1, 2:
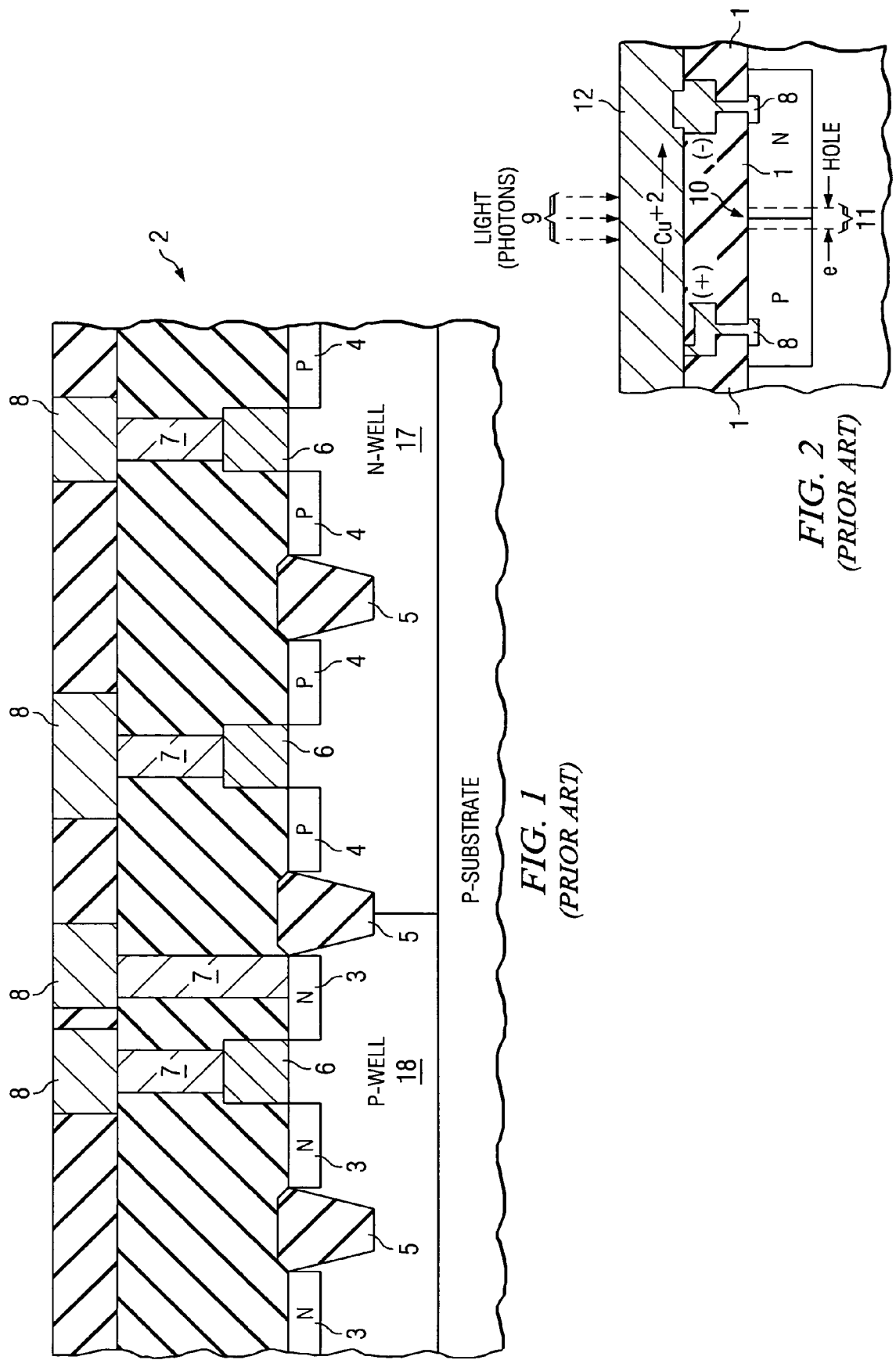
FIG. 1 shows a portion of a generic integrated circuit formed in a silicon wafer, in accordance with the prior art.
FIG. 2 shows the phenomena of photo induced metal corrosion and re-deposition, which occurs during the manufacturing process, in accordance with the prior art.

Referring to the drawings, FIG. 1 depicts a portion 2 of a generic integrated circuit formed in a silicon wafer. Wafer portion, 2, includes numerous doped semiconductor regions. These doped regions are N-type, 3 and 17, and P-type, 4 and 18, regions that define the device sources, 3 or 4, drains, 3 or 4, and wells, 17 and 18. As a result of this structure, there are many P-N junctions located in the wafer portion, 2. The areas of wafer portion, 2, labeled "STI" (Shallow Trench Isolation), 5, denote regions of electrical insulation. In addition, the areas of wafer portion, 2, labeled "gate", 6, denote the gate of an example field effect transistor ("FET").

Example contacts and first layer metal interconnects of wafer portion, 2, are also shown in FIG. 1. Specifically, "W", 7, and "Cu", 8, denotes conductive material made from tungsten and copper, respectfully. This conductive material provides a plurality of contacts and first layer metal interconnects used to connect the example devices with other devices (not shown) on the wafer portion, 2.

Wafer portion, 2, is typically exposed to light at several stages in the manufacturing process. The exposure of the PN junctions to light induces a photovoltaic event that causes photo induced metal corrosion and re-deposition.

An illustration of photo induced metal corrosion and re-deposition is shown in FIG. 2. For this example, copper is used as the metal interconnect that is formed within dielectric material 1. When the light, or more specifically, the photons present in light, 9, strike the P-N junction, 10, then electron/hole pairs are created. These electrons and holes will be swept across the P-N junction in different directions due to the built-in electric field in the depletion region, 11. The separation of the positive charge (holes) and the negative charge (electrons) creates a voltage drop over the junction 10; resulting in the photovoltaic phenomenon at the P-N junction, 10. When the P-N junction is connected to the copper, 8, used as the interconnect metal, a voltage difference in the copper interconnects will be created. If an electrolyte, 12, (i.e. the slurry used in Chemical Mechanical Polishing) exists on the copper surface then the exposed P-N junction will serve as a battery to drive the electrochemical reaction of the copper. For the copper wiring, 8, connected to the P-type region, the oxidation action is accelerated and copper is dissolved into the electrolyte, thereby causing the photo induced copper corrosion. For the copper wiring connected to the n-type region, the reduction action occurs and copper is re-deposited, thereby causing the photo induced copper re-deposition. In summary, there is simultaneously a photo-induced dissolution (corrosion, pitting) at one side of the circuit and a photo induced built-up (re-deposition) on the other side of the circuit.

There are many stages during semiconductor device manufacturing where the photo induced metal corrosion and re-deposition can occur. For example, photo induced metal corrosion and re-deposition can occur during the processes of copper chemical mechanical polishing (Cu CMP), post Cu CMP cleanup, post probe clean, and even during the storage of the wafers in air after Cu CMP. The chemical solution used during the processes mentioned above, and even the moisture in the air, can serve as an electrolyte to provide a conductive path. The typical light present in the semiconductor manufacture facility has a spectrum centered at the visible region, with a range of 1.7–4.0 eV. Therefore, it can easily generate the photovoltaic effect on a Silicon wafer, whose band gap is ~1.12 eV at room temperature.

It is to be noted that photo induced copper redeposition may occur in wafers having device structures entirely different from the example shown in FIG. 1. Furthermore, it is expected that the problem of light induced corrosion and re-deposition will exist for other metals or alloys that may replace copper in the future but are also susceptible to corrosion.

Referring again to FIG. 2, the problem of photo-induced metal corrosion and re-deposition can be reduced or eliminated by forming a photon-blocking layer between the P-N junction 10 and the metal interconnects 8. It is within the scope of this invention to place the photon-blocking layer anywhere between the P-N junction 10 and metal interconnects 8.

Figure 3:
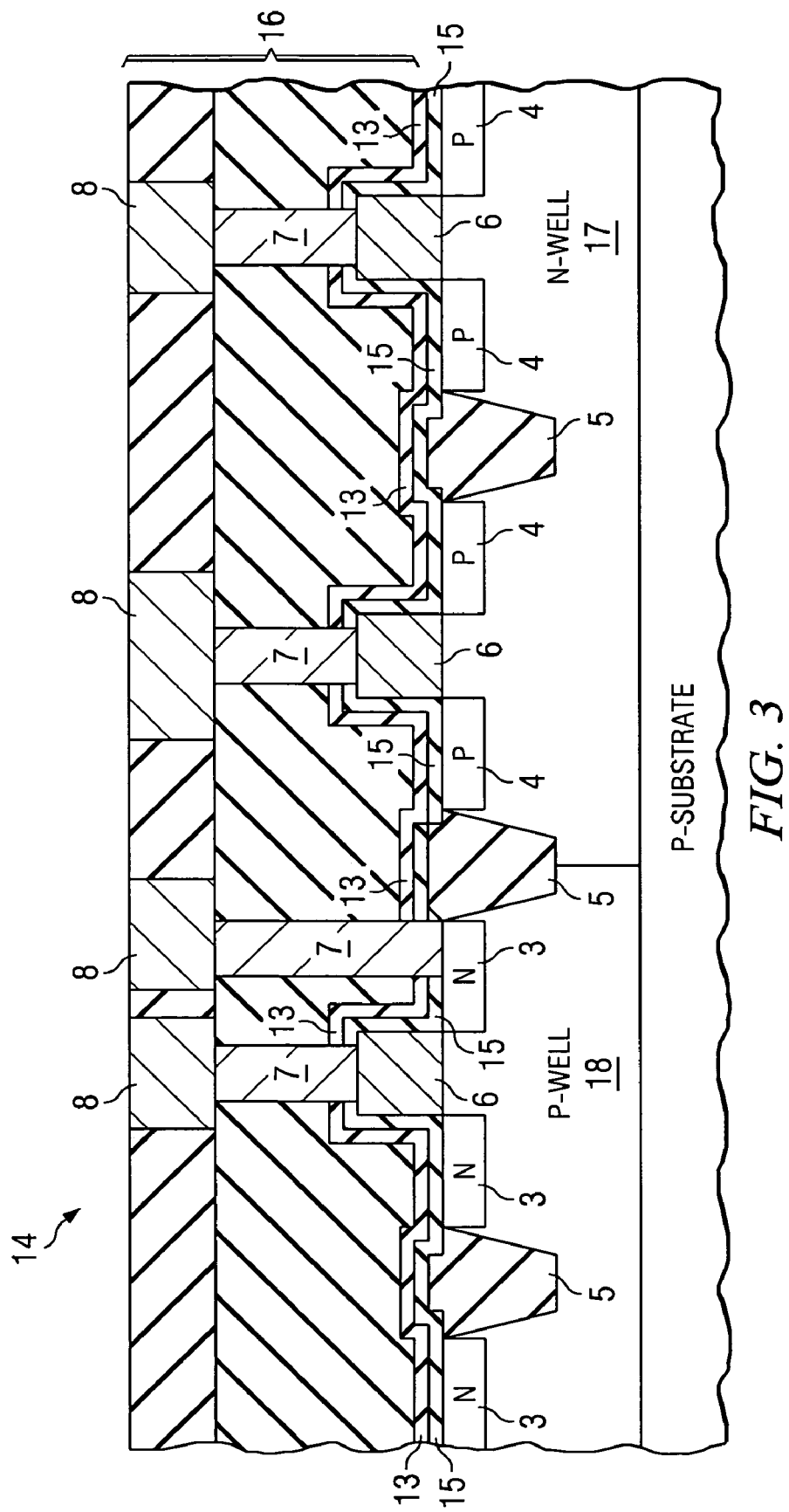
FIG. 3 shows a portion of a silicon wafer in accordance with one embodiment of the present invention.

In accordance with one embodiment of the invention, photo induced copper redeposition can be reduced or eliminated by forming a photon-blocking layer, 13, on a semiconductor wafer, 14, as shown in FIG. 3. A photon-blocking layer, 13, is deposited on top of the silicon nitride contact etch stop layer, 15, but below the Poly-Metal Dielectric ("PMD") layer 16. (A contact etch stop layer is a layer with a lower contact etch rate—compared to the PMD etch rate—that also acts to reduce the leakage current caused by contact-to-active area misalignment during the patterning process.)

In order to effectively prevent photo induced copper corrosion and re-deposition, the photon-blocking layer 13 must be comprised of material that absorbs photon energy greater than the silicon band gap (1.12 eV). It is within the scope of this invention to use any one, or combination of, materials that have acceptable band gap energies. For example, the material comprising the photon-blocking layer may be any of the following: a-SiGe:H, a-SiGe, SiGe, SiC, GaAs, C60, a-Si, Ge, InP, CdSe, CdTe, PbS, PbTe, B, Se, AlSb, $Bi_2S_3$, $Zn_3As_2$, GaTe, GaN, ZnS, and C. It should be noted that materials with a direct band gap have more efficient photon absorption than the indirect band gap counterpart.

It should also be noted that the typical light source used in the semiconductor manufacture facility has an energy spectrum around 1.7–4.0 eV. Therefore, it is desirable for the photon-blocking layer to have an energy gap less than 1.7 eV (which is the lower edge of the energy spectrum of a typical light source used in the semiconductor manufacture facility), in order to achieve effective photon blocking of the light source.

Figure 4:
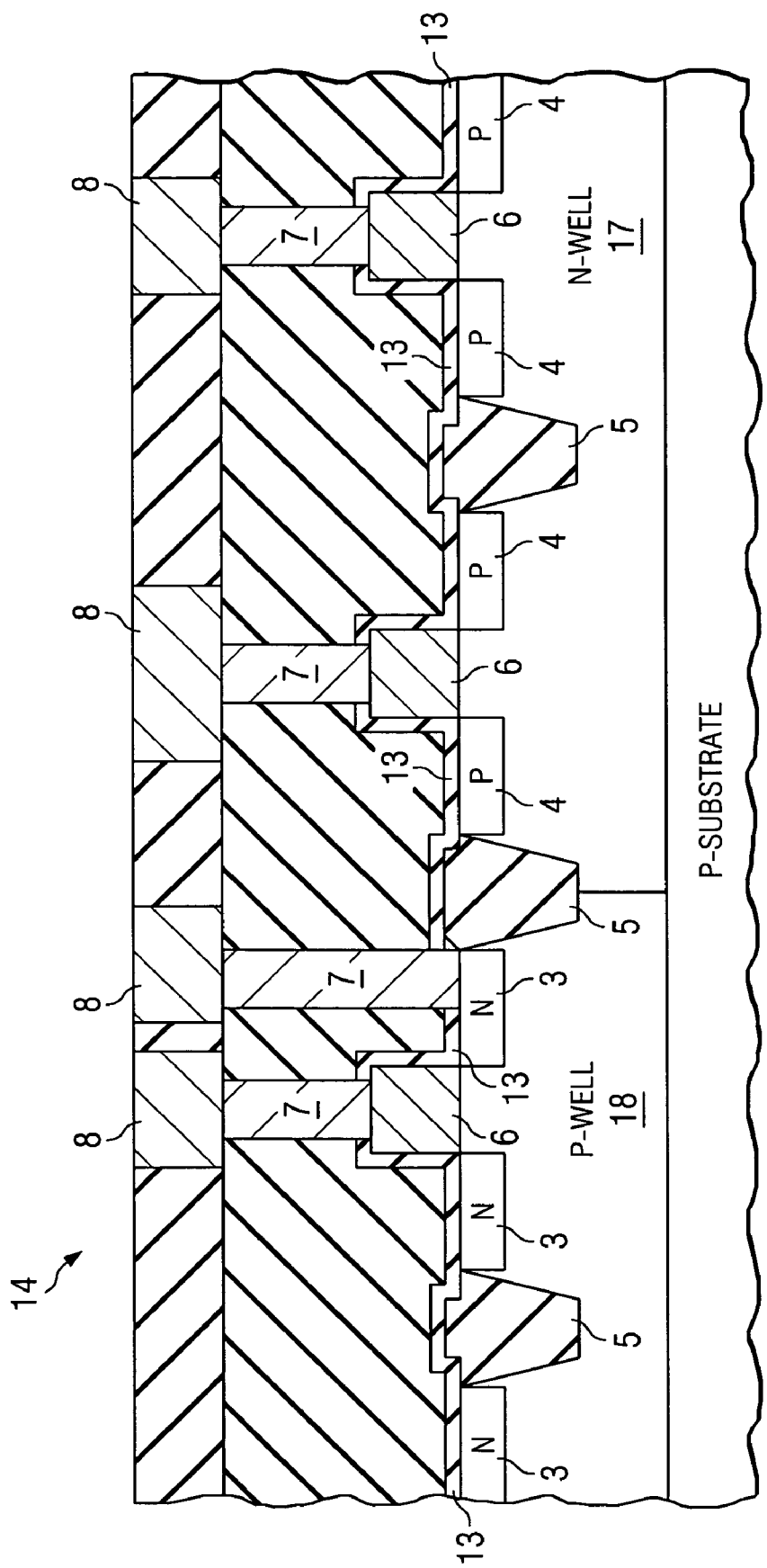
FIG. 4 shows a portion of a silicon wafer in accordance with another embodiment of the present invention.

In the best mode application, shown in FIG. 4, the plasma enhanced nitride contact etch stop layer is replaced by the photon-blocking layer, 13. In this example, the photon-blocking layer, 13, is made of a-SiGe:H. An a-SiGe:H photon-blocking layer is not only capable of photo absorption, but it also serves as a contact etch stop layer because it provides good selectivity during the contact etch process. The photon-blocking layer, 13, will effectively block the transmission of light to the PN junctions during manufacturing. The result is the reduction or elimination of photo induced copper re-deposition.

Various modifications to the invention as described above are within the scope of the claimed invention. As an example, instead of using the invention on silicon-based semiconductor devices, the invention is equally applicable to devices fabricated with other semiconductor materials, such as gallium arsenide. In addition, the invention is applicable in semiconductor wafers having different isolation technologies, well and substrate technologies, dopant types, and transistor and metal types or configurations. Furthermore, the invention is applicable to other semiconductor technologies such as BiCMOS, bipolar, SOI, strained silicon, microelectrical mechanical system ("MEMS"), SiGe, or any other structure using diodes.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor wafer comprising:
    a first region containing diodes and transistors;
    a photon-blocking layer formed on said first region; and
    a second region formed on said photon-blocking region containing metal interconnections.

2. The semiconductor wafer of claim 1 wherein said photon-blocking layer is discontinuous.

3. The semiconductor wafer of claim 1 wherein said photon-blocking layer is comprised of material having a direct band gap.

4. The semiconductor wafer of claim 1 wherein said photon-blocking layer is SiGe.

5. The semiconductor wafer of claim 1 wherein said photon-blocking layer is a-SiGe.

6. The semiconductor wafer of claim 1 wherein said photon-blocking layer is a-SiGe:H.

7. The semiconductor wafer of claim 1 wherein said photon-blocking layer is a contact etch stop layer.

8. The semiconductor wafer of claim 1 wherein said photon-blocking layer is selected from a group consisting of a-SiGe:H, a-SiGe, SiGe, SiC, GaAs, C60, a-Si, Ge, InP, CdSe, CdTe, PbS, PbTe, B, Se, AlSb, $Bi_2S_3$, $Zn_3As_2$, GaTe, GaN, ZnS, and C.

9. The semiconductor wafer of claim 1 wherein said metal interconnections contain copper.

10. The semiconductor wafer of claim 1 wherein said metal interconnections are manufactured using a process that includes CMP.

11. The semiconductor wafer of claim 1 wherein said metal interconnections are manufactured using a process that includes CMP clean.

12. The semiconductor wafer of claim 1 wherein said photon-blocking layer is comprised of material having a band-gap energy that is less than a lower edge of an energy spectrum of a light source used in a semiconductor manufacturing facility.

13. A semiconductor wafer comprising:
    a first region containing diodes and transistors;
    a photon-blocking layer formed on said first region, said photon-blocking layer having a direct band gap and a band gap energy less than or equal to 1.7 eV; and
    a second region formed on said photon-blocking region containing copper interconnections.

14. The semiconductor wafer of claim 13 wherein said photon-blocking layer is also a contact etch stop layer.

* * * * *